United States Patent [19]

Frank

[11] Patent Number: 4,912,430

[45] Date of Patent: Mar. 27, 1990

[54] CURRENT SOURCE AS A MICROWAVE BIASING ELEMENT

[75] Inventor: Michael L. Frank, Santa Clara, Calif.

[73] Assignee: Avantek, Inc., Milpitas, Calif.

[21] Appl. No.: 356,889

[22] Filed: May 24, 1989

[51] Int. Cl.$^4$ .............................................. H03F 3/193
[52] U.S. Cl. ................................. 330/277; 330/290; 330/296
[58] Field of Search .................... 330/277, 290, 296

[56] References Cited

U.S. PATENT DOCUMENTS

| | | | |
|---|---|---|---|
| 3,359,503 | 12/1967 | Warner, Jr. ......................... | 330/277 |
| 4,004,164 | 1/1977 | Cranford, Jr. et al. ............. | 307/297 |
| 4,390,851 | 6/1983 | Higgins et al. ...................... | 330/277 |
| 4,500,848 | 2/1985 | Marchand et al. ............. | 330/277 X |
| 4,612,514 | 9/1986 | Shigaki et al. .................. | 330/290 X |
| 4,661,789 | 4/1987 | Rauscher ............................. | 333/202 |
| 4,686,387 | 8/1987 | Rumelhard ..................... | 307/296 R |
| 4,749,959 | 6/1988 | Cripp et al. .......................... | 330/277 |
| 4,771,247 | 9/1988 | Jacomb-Hood ..................... | 330/277 |

FOREIGN PATENT DOCUMENTS 122466 3/1944 Australia .
369578 4/1932 United Kingdom .

Primary Examiner—James B. Mullins
Attorney, Agent, or Firm—Philip M. Shaw, Jr.

[57] ABSTRACT

A circuit for biasing a field effect transistor using a current source to provide a constant current which can be shared between amplifier stages by connecting it to the drain of a first stage and the source of a second stage.

10 Claims, 1 Drawing Sheet

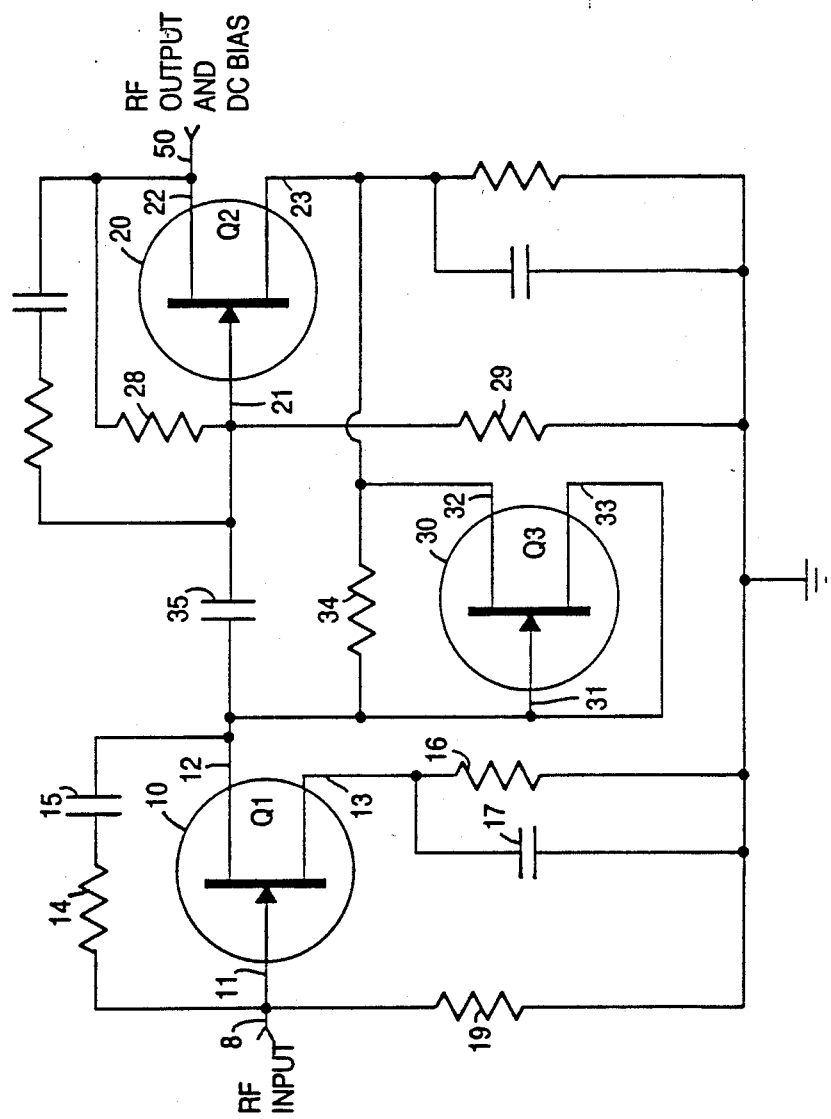

4,912,430

CURRENT SOURCE AS A MICROWAVE BIASING ELEMENT

BACKGROUND OF THE INVENTION

1. Field of the Invention

The present invention relates to the performance of monolithic microwave integrated circuit ("MMIC") amplifiers and more particularly to a biasing circuit for a field effect transistor ("FET").

2. Discussion of the Prior Art

In a typical two stage MMIC amplifier, two FETs sharing the same biasing source are connected in series at microwave frequencies. In order to impede the flow of microwave energy and the resultant losses thereof while still allowing DC current to flow, an element must be placed between the stages. There are two well known solutions, use of an inductor or a resistor.

Use of an inductor limits the bandwidth that is achievable because at low frequencies, the inductor must be large enough to stop the signal, whereas at high frequencies, the inductor must be small to stop in band resonances. Thus, the choice of bias circuitry influences the bandwidth that is achievable. Further, inductors are physically large and their performance is improved with increased size. This is clearly undesirable in MMIC fabrication where the goal is to make the circuit as small as possible.

A resistor is a smaller device and bandwidth considerations are absent. However, there are bias constraints. If the resistor is large enough so that the signal is not loaded down, then relatively large voltages are required. A number of systems could not accommodate this device as most systems have +12 V or less available. Further, significant power is wasted, making the chip inefficient. If the resistor chosen is small, then less voltage is required, but a low impedance path to ground is presented. Consequently, both gain and efficiency suffer. Another problem with using a resistor is that in mass fabrication of circuits, the pinchoff voltage of the FET cannot be held to close tolerances, thus the transistor will bias at different operating points. Consequently, both the amount of current going to the first device and the percentage of IDSS current the device sees are variable and dependent on difficult to control fabrication factors. This variation in current translates to a variation in DC voltages across the biasing resistor. The total voltage must be shared between the two FETs and the biasing resistor. If the resistor takes too much voltage, the FETs will lose $G_m$ and, in extreme cases, the FETs may not operate at all. Where the left over voltage is marginal, the device will be subject to temperature failure.

SUMMARY OF THE INVENTION

It is the object of this invention to provide a bias element for a two stage FET amplifier which is small, has a high impedance, requires little voltage, has a large bandwidth, and compensates for DC variation in the gain stages.

These and other objects can be accomplished by using a gallium arsenide ("GaAs") FET as the biasing element. The GaAs FET is configured as a current source and supplies a constant current to bias the FET amplifier, thus limiting large voltage variations across the drain to source region.

BRIEF DESCRIPTION OF THE DRAWINGS

The FIGURE is a circuit schematic of a first embodiment.

DETAILED DESCRIPTION OF THE INVENTION

A schematic diagram of an MMIC FET amplifier according to the invention as described below is shown in the FIGURE A cascade of different size FETs is used. The size of the gate to source capacitance ("$C_{gs}$") of the first stage FET 10 is chosen to provide a good input match. The size of the transconductance ("$g_m$") of the second stage FET 20 is chosen to provide an acceptable gain. These choices dictate the size (or gate periphery) of these two devices.

An RF input signal 8 is applied to the first stage FET 10 at its gate electrode 11. The first stage FET 10 consists of a gallium arsenide ("GaAs") FET chosen to have a 250 micron gate length, providing about 3 dB of gain. A shunt feedback loop connects the first stage drain output 12 to the first stage gate input 11 through a feedback resistor 14 connected in series with a DC block capacitor 15. Another resistor 19 is connected in parallel to the input in order to improve input VSWR beyond what is achievable with shunt feedback alone, and to ground this terminal. The first stage bias is then set by connecting the first stage source electrode 13 to a "self-bias" source resistor 16 which is bypassed by a capacitor 17 in order to float the DC ground and provide a short path to AC ground.

The second stage FET 20 is chosen to be a 350 micron gate length GaAs FET, providing an additional 7 dB of gain. The second stage also has shunt feedback and self-biasing networks similar to the first stage. There is a DC power supply 50 connected to the second stage drain electrode 22. Note this electrode also serves as the RF output terminal for the structure. A resistive divider network, resistors 28 and 29, apply the correct bias voltage to the second stage gate electrode 21.

A third GaAs FET 30, wired as a constant current source, connects the second stage source terminal 23 to the first stage drain terminal 12. This constant current source serves to stabilize the bias currents of the RF FETs, making them less dependent on unavoidable process variations. It also exhibits the desirable property of suppressing the second harmonic content of the output waveform when the MMIC is operating in a large signal condition. A 500 ohm resistor 34 is connected in parallel to the current source to prevent the constant current source from taking most of the available voltage. This resistor is large enough with respect to the internal impedances to not affect the gain of the device significantly, yet small enough to help make the device less sensitive to variations in the pinchoff voltage. A DC blocking capacitor 35 is also required between the first and second stages to prevent the first stage drain voltage from becoming the second stage gate voltage.

Although the present invention has been shown and described with respect to preferred embodiments, various changes and modifications which are obvious to a person skilled in the art to which the invention pertains are deemed to lie within the spirit and scope of the invention.

What is claimed is:

1. An amplifier biasing circuit comprising:

(a) a first stage field effect transistor amplifier having gate, source and drain electrodes;
(b) a second stage field effect transistor amplifier having gate, source and drain electrodes;
(c) means for providing a constant current between the second stage source electrode and the first stage drain electrode;
(d) means for blocking the flow of direct current voltage from the first to the second stage.

2. A biasing circuit according to claim 1, wherein the constant current means comprises a third field effect transistor having gate, source and drain electrodes, and a resistor connected between the drain and gate electrodes of the third field effect transistor and further wherein the third field effect transistor source and gate electrodes are commonly connected to the first stage drain electrode and the third field effect transistor drain electrode is connected to the second stage source electrode.

3. A biasing circuit according to claim 2, wherein the third field effect transistor is a gallium-arsenide field effect transistor.

4. A biasing circuit according to claim 1, further comprising:
(a) means for providing a shunt feedback signal from the first stage drain electrode output to the first stage gate electrode input;
(b) means for providing a shunt feedback signal from the second stage drain electrode output to the second stage gate electrode input.

5. A biasing circuit according to claim 1, wherein the first and second stage amplifiers are both gallium-arsenide field effect transistors.

6. A biasing circuit according to claim 1, wherein the first stage field effect transistor has a gate length of 250 microns and the second stage field effect transistor has a gate length of 350 microns.

7. An amplifier circuit comprising:
(a) a first stage field effect transistor amplifier having gate, source and drain electrodes, further comprising:
  (i) an input terminal connected to the gate electrode of the first stage field effect transistor;
  (ii) means for providing a shunt feedback signal from the drain electrode of the first stage field effect transistor to the gate electrode of the first stage field effect transistor, and including first means for blocking direct current signals at radio frequencies;
  (iii) means for biasing the source electrode of the first stage field effect transistor, whereby the direct current voltage present at the source electrode of the first stage field effect transistor is "floated" and independent from alternating current ground;
(b) a second stage field effect transistor amplifier having gate, source and drain electrodes, further comprising:
  (i) means for applying direct current power to the drain electrode of the second stage field effect transistor;
  (ii) means for providing a shunt feedback signal from the drain electrode of the second stage field effect transistor to the gate electrode of the second stage field effect transistor and including second means for blocking direct current;
  (iii) means for biasing the source electrode of the second stage field effect transistor, whereby the direct current voltage present at the source electrode of the second stage field effect transistor is "floated" and independent from alternating current ground;
  (iv) a resistive divider network connected between the drain electrode of the second stage field effect transistor and ground for supplying bias voltage to the gate electrode of the second stage field effect transistor;
(c) means for providing a constant current between the second stage source electrode and the first stage drain electrode, the constant current means including a third field effect transistor having gate, source and drain electrodes, wherein the third field effect transistor source and gate electrodes are commonly connected to the first stage drain electrode, the third field effect transistor drain electrode is connected to the second stage source electrode, and a resistor is connected between the drain and gate electrodes of the third field effect transistor; and
(d) third means for blocking the flow of direct current voltage from the first to the second stage.

8. A biasing circuit according to claim 7, wherein the first and second stage amplifiers are both gallium-arsenide field effect transistors.

9. A biasing circuit according to claim 7, wherein the third field effect transistor is a gallium-arsenide field effect transistor.

10. A biasing circuit according to claim 7, wherein the first stage field effect transistor has a gate length of 250 microns and the second stage field effect transistor has a gate length of 350 microns.

* * * * *